US 6,270,571 B1

(12) United States Patent
Iwasaki et al.

(10) Patent No.: US 6,270,571 B1
(45) Date of Patent: Aug. 7, 2001

(54) METHOD FOR PRODUCING NARROW WIRES COMPRISING TITANIUM OXIDE, AND NARROW WIRES AND STRUCTURES PRODUCED BY THE SAME METHOD

(75) Inventors: Tatsuya Iwasaki, Machida; Tohru Den, Tokyo, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/436,989

(22) Filed: Nov. 9, 1999

(30) Foreign Application Priority Data

Nov. 10, 1998 (JP) .................................. 10-318552
Nov. 1, 1999 (JP) .................................. 11-310601

(51) Int. Cl.⁷ .................................. C30B 23/00
(52) U.S. Cl. .................. 117/88; 117/4; 117/8; 117/9; 117/921; 117/944; 423/598; 205/123; 148/240; 148/277; 148/281
(58) Field of Search .................. 117/921, 944, 117/88, 4, 8, 9; 148/240, 277, 281; 205/123; 423/598

(56) References Cited

FOREIGN PATENT DOCUMENTS 8-302498    11/1996  (JP) .

OTHER PUBLICATIONS

Borello et al, "Quantum–size effects in the titanoslicate molecular sieve", Applied Physics letters vol. 71, No. 16, pp. 2319–2321, Oct. 1997.*
Gerchikov et al., "Trapping of low energy inert gas ions by polycrystalline titanium and titanium dioxide surfaces", Soviet Physics–Technical Physics, vol. 52, No. 1, pp. 136–137, Jan. 1982.*
Deguchi et al., "Photocatalytically highy active nanocomposite films consisting of TiO2", Journal of Electrochemical Society vol. 147 No. 6 pp. 2263–2267, 2000.*

Brian O'Regan & Michael Grätzel, "A Low–Cost, High–Efficiency Solar Cell Based on Dye–Sensitized Colloidal $TiO_2$ Films," 353 Nature p. 737 (Oct. 24, 1991).
Scientific Correspondence, "Light–Induced Amphiphilic Surfaces," 388 Nature p. 431 (Jul. 31, 1997).
Hideki Masuda, et al., "Fabrication of Porous $TiO_2$ Films Using Two–Step Replication–of Microstructure of Anodic Alumina," Jpn. Appl. Phys. Pp. L 1775–L 1777 (Dec. 15, 1992).
15 J. of Materials Sci. Let. pp. 1228–1230 (1996).
Christian Coddet, et al., "Sur la Croissance de Trichites au Cours de l'Oxydation du Titane et de l'Alliage TA6V4 par la Vapeur d'Eau à Haute Température," t.281 C. R. Acad. Sc. Paris pp. 507–510 (Sep. 29, 1975).
A. K. Bhattacharya, et al., "Inorganic Sol Gel Synthesis of Zirconium Titanate Fibres," 31 J. of Materials Sci. pp. 5583–5586 (1996).
M. K. Nazeeruddin, et al., "Conversion of Light of Electricity by cix–$X_2$Bis (2,2'–bipyridyl–4,4'–dicarboxylate)ruthenium (II) Charge Transfer Sensitizers (X= Cl⁻, Br⁻, I⁻, CN⁻, and SCN–) on Nanocrystalline $TiO_2$ Electrodes," 115 J. Am. Chem. Soc. pp. 6382–6390 (1993).
Harada, et al., "Preparation and Mechanical Properties of AC8A Aluminum Alloy Composite Reinforced with Potassium Titanate Whisker," J. Japan Inst. Metals, vol. 58, (1994); pp. 69–77.

* cited by examiner

Primary Examiner—Robert Kunemund
(74) Attorney, Agent, or Firm—Fitzpatrick, Cella, Harper & Scinto

(57) ABSTRACT

A method for producing narrow wires including titanium oxide of high crystallinity and diameter of the order of nanometer, in particular whiskers of titanium oxide, and including a first step of preparing a base having a titanium-including surface, second step of discretely depositing a material other than titanium over the above surface, and third step of thermally treating the above surface, obtained by the second step, in a titanium-oxidizing atmosphere.

36 Claims, 5 Drawing Sheets

METHOD FOR PRODUCING NARROW WIRES COMPRISING TITANIUM OXIDE, AND NARROW WIRES AND STRUCTURES PRODUCED BY THE SAME METHOD

BACKGROUND OF THE INVENTION

1. Field of the Invention

The present invention relates to a method for producing narrow wires comprising titanium oxide, and narrow wires and structures produced by the same method, in particular a method for producing titanium oxide whiskers. More particularly, the titanium oxide whisker is useful for a variety of areas as a functional material for electronic devices and microdevices, or as a structural material. More concretely, the whisker as a functional material is useful for, e.g., photoelectric transducers, photocatalytic devices and electron-emitting materials.

2. Related Background Art

Titanium oxide-based materials have been extensively studied to apply their photosemiconducting characteristics and photocatalytic functions to photovoltaic cells, decomposition of toxic materials and antimicrobial purposes.

For example, Japanese Patent Application Laid-Open No. 8-302498 discloses examples in which finely powdered titanium oxide is used as a construction material for its antimicrobial function.

M. Gratzel et al. made, on a trial basis, a wet type photovoltaic cell using microparticles of $TiO_2$, several nm in size, prepared by spreading colloidal solution and heating (baking), which shows an energy conversion efficiency of 7.1 to 7.9% (B. O'Regan et al., "NATURE," 353 (1991) 737). This relatively high conversion efficiency is realized by decreasing size of titanium oxide particles to the order of nanometer to increase their surface area.

More recently, it is reported that titanium oxide comes to show a unique surface characteristics of being macroscopically hydrophilic and oleophilic when irradiated with ultraviolet ray, because of formation of hydrophilic and oleophilic regions, 30 to 80 nm in size, on the surface ("NATURE," 388 (1997) 431).

These phenomena suggest that titanium oxide potentially exhibits new functions, when its size is decreased to the order of nanometer. It is discussed that titanium oxide as an n-type semiconductor exhibits characteristic electrical, optical and chemical properties in containment of electrons and surface functions, when its size is decreased to a certain characteristic level. However, the mechanisms involved are largely left unknown.

Therefore, titanium oxide material is expected to have wide applications as a new functional material for, e.g., electronic devices and microdevices, and also as a structural material.

SUMMARY OF THE INVENTION

It is expected that titanium oxide material shows further improved electrical, optical and chemical properties, e.g., photoelectric conversion function, if it can be reduced in size to the order of nanometer and have high crystallinity. However, it was difficult to produce titanium oxide material having a nanometer-order size and high crystallinity by a simple procedure.

The methods to produce materials of the order of nanometer in size include photolithography, and other semiconductor processing techniques for fine pattern drawing, e.g., exposure to electron beams or X-ray. However, these methods involve disadvantages, such as insufficient product yield and high apparatus cost. Therefore, a method producing materials of desired properties at high repeatability by a simple procedure has been increasingly in demand.

The above-mentioned fine particle production method, proposed by above mentioned M. Gratzel et al., is a relatively simple one involving colloidal solution spreading and heating (baking). However, this method can stand further improvement in controllability and repeatability of crystallinity and fine particle shape of titanium oxide prepared.

One of the other methods proposed so far is the one by Masuda et al., in which a replica of alumina produced by anodic oxidation is made by titanium oxide, to form porous $TiO_2$ ("Jpn. J. Appl. Phys.,", 31 (1992), L.1775 to L.1777, and "J. of Materials Sci. Lett.," 15 (1996) 1228 to 1230). The disadvantages involved in this method are a number of time-consuming steps for production of the replica, and insufficient crystallinity of $TiO_2$ prepared by electrodeposition.

The whisker crystal is known as one of the materials of high crystallinity. It is produced by reduction or vapor-phase deposition of a halide as the starting material, and these methods are already applied to synthesis of titanium compounds, e.g., TiC and TiN.

One of the examples of the titanium oxide whisker is potassium titanate in size in submicron unit, which is being applied to fiber-reinforced plastics, metals and ceramics ("Magazine of Japan Metallurgical Society," 58 (1994), 69 to 77). However, these are powdery, and have not been spread over a substrate. These whiskers have dimensions of 0.2 to 1.0 $\mu$m in diameter and 5 to 60 $\mu$m in length, and must be finer to bring about the effects which would be exhibited by those of the order of nanometer in size.

Another method is proposed by C. Coddet et al., heat treatment of a Ti plate in a $H_2O$-containing atmosphere, to grow the titanium oxide whisker ("C. R. Acad. Sc. Paris," t.281 (1975) 507 to 510). The whisker produced by this method, however, is relatively thick at around 10 $\mu$m in diameter.

The present invention provides titanium oxide materials of high crystallinity and free of the above problems, in particular narrow wires and whiskers of titanium oxide having a size of the order of nanometer, and a method for producing the same. The present invention also provides a nano-structure with the above narrow wires or whiskers of titanium oxide deposited on a base.

The present invention is developed to solve the above problems. A first preferred aspect of the present invention is a method for producing narrow wires comprising titanium oxide, wherein said method comprises:

(A) a first step of preparing a base having a titanium-comprising surface, (B) a second step of discretely depositing a material other than titanium on the surface, and (C) a third step of thermally treating the said titanium-comprising surface, obtained by the second step, in a titanium-oxidizing atmosphere.

A second preferred aspect of the present invention is a method for producing narrow wires comprising titanium oxide, wherein said method comprises:

(A) a first step of preparing a base having a titanium-comprising surface, (B) a second step of depositing a material other than titanium on the surface in a island structure, and (C) a third step of thermally treating said titanium-comprising surface, obtained by the second step, in a titanium-oxidizing atmosphere.

A third preferred aspect of the present invention is a method for producing narrow wires comprising titanium oxide, wherein said method comprises:

(A) a first step of preparing a base having a titanium-comprising surface, (B) a second step of roughening the surface, and (C) a third step of thermally treating the surface in a titanium-oxidizing atmosphere.

A fourth preferred aspect of the present invention is a method for producing narrow wires comprising titanium oxide, wherein said method comprises:

(A) a first step of preparing a base having a titanium-comprising surface, (B) a second step of depositing a metallic element other than titanium over the surface, by bringing a liquid containing the metallic element in contact with the above surface, and (C) a third step of thermally treating the surface in a titanium-oxidizing atmosphere.

A fifth preferred aspect of the present invention is a method for producing narrow wires comprising titanium oxide, wherein said method comprises:

(A) a first step of preparing a base having a titanium-comprising surface, (B) a second step of irradiating the surface with ultraviolet ray, and (C) a third step of thermally treating the above surface in a titanium-oxidizing atmosphere, to form narrow wires comprising titanium oxide on the surface.

The method of the present invention can produce, on a large scale, narrow wires comprising titanium oxide of high crystallinity and size of the order of nanometer, in particular titanium oxide whiskers, in a highly controllable manner.

DETAILED DESCRIPTION OF THE PREFERRED EMBODIMENTS

The method for producing narrow wires comprising titanium oxide of the present invention will be described by referring to FIGS. 2A to 2C.

The method of the present invention thermally treats a base with titanium on the surface in an oxidative atmosphere, to grow the narrow wires comprising titanium oxide from the base surface.

In particular, the base with titanium on the surface, used for the present invention, has an uneven surface morphology. Use of the base with uneven (nonhomogeneous) surface morphology reduces titanium oxide whisker diameter and increases whisker production yield.

Uneven morphology of the surface having titanium means there are a number of regions, different in surface morphology from each other and having a size of several microns to the atomic scale, distributed over a wide area of the surface. Decreasing size of each region is preferable in the present invention for decreasing titanium oxide whisker diameter.

The titanium-comprising surface can be made morphologically uneven in various aspects; it may be uneven in geometrical shape (e.g., irregularities); physical structure (e.g., material, composition, crystal orientation or crystallinity); surface-chemical conditions (e.g., dangling bond, surface terminal element, or surface layer of oxide or its thickness); or physicochemical property resulting from the above (e.g., work function, hydrophilicity, resistivity, melting point or dielectric constant).

Figure 2A:
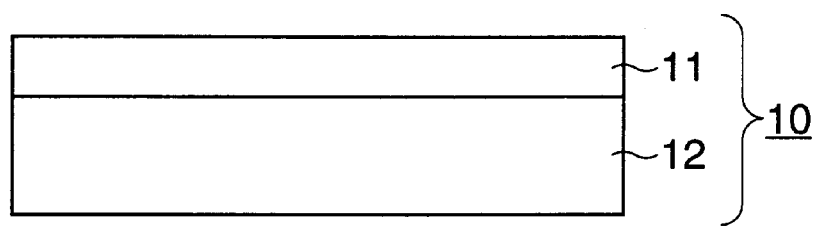
FIGS. 2A, 2B and 2C show one embodiment of the method for producing the titanium oxide whiskers and nano-structure of the present invention.
Figure 2B:
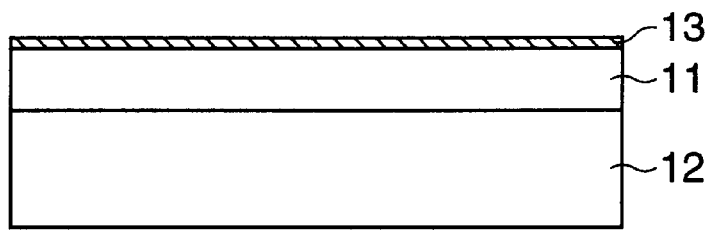
Figure 2C:
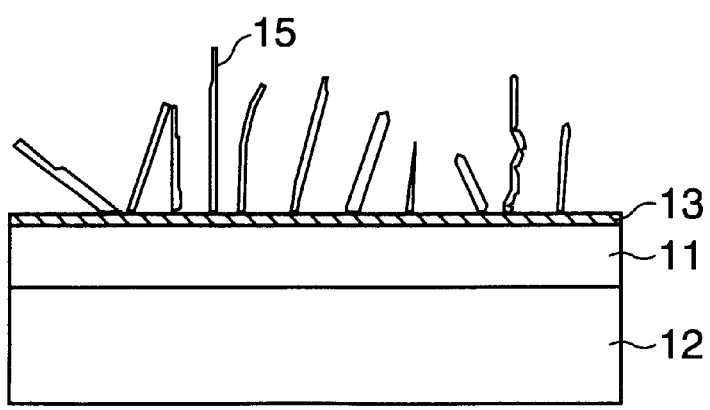

One embodiment of the method for producing narrow wires comprising titanium oxide of the present invention is described more concretely, by referring to FIGS. 2A to 2C in this order, where 10: base, 11: film comprising Ti as the major ingredient, 12: substrate, and 15: narrow lines comprising titanium oxide.

Step A (refer to FIG. 2A)

This step is for preparation of a base (substrate) 10 having a titanium-comprising surface.

The substrate 10 is not limited so long as it has titanium on the surface. The preferable ones include a plate of titanium or titanium alloy, and substrate 12 of silica glass, Si or the like coated with a film 11 comprising Ti as the major ingredient, as shown in FIG. 2A.

The film 11 comprising Ti as the major ingredient can be prepared by various methods, such as deposition of Ti by resistance heating, EB deposition, sputtering, CVD or plating.

Step B (refer to FIG. 2B)

The base prepared by Step A is treated to make the Ti-comprising surface morphologically uneven.

More concretely, the surface can be made uneven by coating the Ti-comprising base surface with a material other than Ti (a first procedure), bringing (applying) a liquid containing a metallic element other than Ti in contact with the Ti-comprising base surface (a second procedure), by roughening the Ti-comprising base surface (a third procedure), or irradiating the Ti-comprising base surface with ultraviolet ray (a forth procedure).

The first procedure deposits a small quantity of a metallic element other than Ti (e.g., Li, Na, K, Mg, Ca, Sr, Ba, Sc, Y, La, Cu, Zn, Al, Zr, or Mo) on the base to an extent not covering the entire surface area. In other words, the above metal is distributed discretely or in island structure on the surface including Ti. This secures a number of regions comprising the part where the surface including Ti is exposed, and the part covered by metallic elements other than Ti, making the surface morphologically uneven.

The metallic element can be deposited discretely or in island structure by resistance heating, EB deposition, sputtering, CVD or sol-gel film-making method.

The second procedure makes the Ti-comprising base surface morphologically uneven by bringing (applying) a solution dissolving ions of an element other than titanium in contact with the surface. This allows the ions dissolved in the solution to act on the Ti-comprising surface, effecting the terminal treatment of the surface thereby making it morphologically uneven.

The preferable metals other than Ti include Li, Na, K, Mg, Ca, Sr, Ba, Sc, Y, La, Cu, Zn, Al, Zr and Mo.

The second procedure may be further effected by use of an acidic solution that dissolves metallic ions, to attach these ions to the Ti-comprising base surface and, at the same time, to oxidize the surface. It may be also effected by use of an acidic solution that dissolves metallic ions as the so-called electrolytic solution for anodic oxidation with the Ti-comprising surface serving as the anode.

Figure 5:
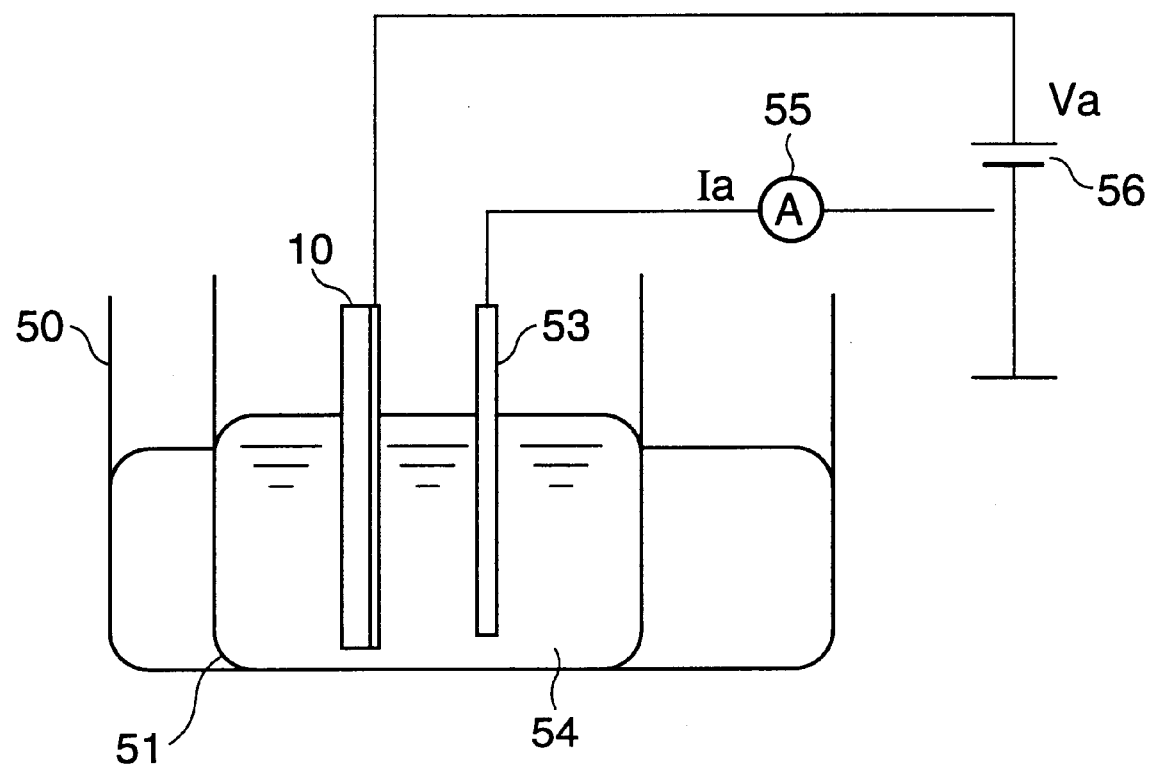
FIG. 5 shows a conceptual view of an anodic oxidation apparatus.

FIG. 5 schematically shows an anodic oxidation apparatus, which may be used for the above anodic oxidation steps.

The numeral 50 designates constant-temperature bath, 51: reactor, 10: base serving as the anode, 53: Pt cathode, 54: electrolytic solution, 56: power source for anodic oxidation voltage, and 55: ammeter for measurement of anodic oxidation current. One of the devices not shown is a computer for automatic control and measurement of voltage and current. The base 52 and cathode 53 are placed in the electrolytic solution kept at constant temperature by the constant-temperature water bath, and a voltage is applied to between the base (anode) and cathode for anodic oxidation.

The acid solution useful for the present invention as the electrolytic solution includes those of oxalic, phosphoric sulfuric chromic acids. The conditions for anodic oxidation, e.g., voltage and temperature, can be set appropriately.

The example described above uses electrolytic solution (acidic solution) containing the ions for the anodic oxidation process. However, the Ti-comprising surface may be treated by anodic oxidation with an electrolytic solution free of the above ions, and then treated with a solution containing the above metallic ions.

Each of the above first and second procedures attaches an element other than Ti to the Ti-comprising surface, thereby securing the morphologically uneven surface.

It is considered that the element other than Ti, attached by the first or second procedure, serves as the origin during the thermal treatment step described later, from which the narrow wire comprising titanium oxide grows. It is also considered that the element catalyzes growth of the narrow wire.

The third procedure roughens the Ti-comprising surface to provide irregularities thereon, chemically by an etching solution, or physically by blasting or grinding or plasma treatment. Thus, the Ti-comprising surface may be made morphologically uneven by providing irregularities thereon. The degree of the roughness is preferably $R_A \leq 1$ $\mu$m.

The fourth procedure irradiates the Ti-comprising surface with ultraviolet ray to make it morphologically uneven, conceivably by forming regions of different chemical conditions (e.g., different oxidation number of Ti) on the surface. This effect can be observed much more notably, when the surface is irradiated with ultraviolet ray in an oxidative atmosphere (e.g., in an acidic solution or ozone atmosphere).

The processes described above adopt Steps A and B separately. However, the morphologically uneven surface (nonhomogeneous surface) may be formed during Step A.

More concretely, when the substrate 12 is coated with the film 11 comprising Ti as the major ingredient during Step A, grains may be formed or abnormal growth of these grains may be caused in the thin film by adopting adequate film-making conditions, to make the base 10 morphologically uneven. Step A may be followed directly by Step C (thermal treatment step in an oxidative atmosphere), by omitting Step B, when the morphologically uneven film 11 comprising Ti as the major ingredient is formed during Step A. However, it is preferable to effect Step B separately in a well controlled manner.

As discussed above, Step B gives the Ti-comprising surface of uneven morphology, and hence reduces diameter of the produced narrow wires comprising titanium oxide, conceivably resulting from formation of the uneven (nonhomogeneous) regions on the Ti-comprising surface, leading to reduced diameter of the narrow wires of titanium oxide.

More concretely, it is possible in the present invention to accelerate growth of the narrow wires from the uneven (nonhomogeneous) regions and interfaces between these regions, produced by forming fine irregularities or fine regions of different surface conditions on the Ti-comprising surface, or attaching another type of element to the surface, before it is thermally treated to form the narrow wires comprising titanium oxide. It is considered that the surface defects or surface sites of reduced titanium oxidation number, massively present in the interfaces between the dissimilar materials and grain boundaries, tend to become the origins from which the narrow wires are formed, although the mechanisms involved are not fully substantiated. It is also considered that treatment with an acidic solution or ultraviolet ray contributes to reinforcement of the grain boundaries, or increase in number of the surface sites.

Step C (refer to FIG. 2C)

Step C follows Step B to thermally treat the base in a titanium-oxidizing atmosphere.

This step reacts titanium on the base with the oxidative atmosphere, to form the narrow wires 15 of titanium oxide.

One example of the reactor system for the thermal treatment will be described by referring to FIG. 4, wherein 41: reactor, 10: base described earlier, 43: infrared ray absorbing plate, which also serves as the sample holder, 44: gas tube by which the oxidative gas is introduced into the reactor, the tube preferably being arranged in such a way to make the starting gas concentration uniform around the base, 46: gas exhaust line, connected to a turbo molecular pump or rotary pump, 47: infrared ray lamp for heating the substrate, and 48: light-collecting mirror to efficiently focus infrared ray onto the infrared ray absorbing plate. The reactor system is also equipped a vacuum gauge to monitor pressure within the reactor, and a thermocouple unit to measure temperature of the base, although not shown. It is needless to say that reactor systems of other configurations, e.g., an electrical oven type which heats the whole reactor from the exterior, can be used for the present invention.

The thermal treatment conditions, e.g., oxidative atmosphere and temperature, can be set adequately. Treatment temperature is preferably in a range from 600° C. to 900° C.

$H_2O$ gas or $O_2$ gas may be used for the oxidative atmosphere to oxidize Ti. The oxidative atmosphere may be incorporated with an inert gas to control the total pressure at an adequate level. $H_2O$ gas (water vapor) is a particularly preferable for the oxidative atmosphere to oxidize Ti.

It is also preferable that the oxidative atmosphere is incorporated with $H_2$, because it helps reduce diameter of the narrow wire of titanium oxide and increase product yield.

As discussed above, the method of the present invention for producing the narrow wires of titanium oxide treats the base having elementary titanium on the surface to make the surface morphologically uneven, and then thermally treats it in an oxidative atmosphere (e.g., of steam or $O_2$), to grow titanium oxide in narrow wires by the vapor phase (oxidative atmosphere)-solid phase (titanium) reaction.

The method of the present invention can produce the titanium oxide whiskers with controlled shape, several nanometers to several microns in narrow wire diameter and several tens nanometrers to several tens microns in length.

It comprises Steps A to C, and can produce the narrow wires comprising titanium oxide.

Next, the narrow wire 15 of titanium oxide, produced by the method of the present invention, will be described.

The method of the present invention can produce the narrow wires comprising titanium oxide, as described above, in particular the titanium oxide whiskers of high crystallinity. The titanium oxide whisker may have a rutile or anatase type crystal structure, depending on production conditions under which it is synthesized. Whiskers frequently mean crystals grown to have needle shapes. The whiskers produced by the method of the present invention take linear shapes (bent, branched, spiral or in other shapes) of sufficiently high aspect ratio, irrespective of their crystallinity.

Figure 1A:
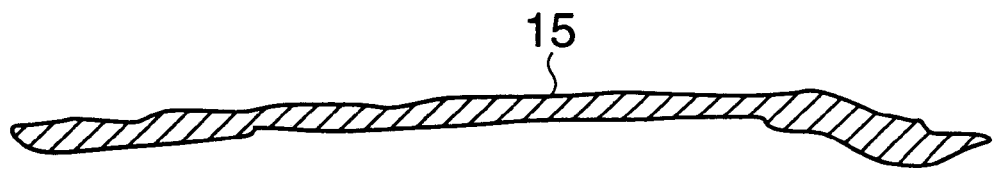
FIGS. 1A, 1B, 1C and 1D show a schematic view of one conceptual example of the titanium oxide whisker of the present invention.
Figure 1B:
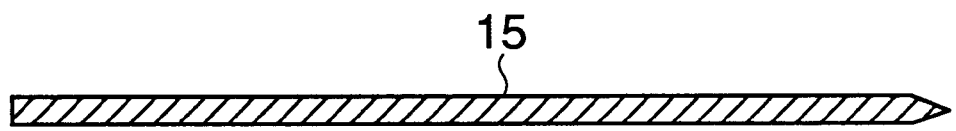
Figure 1C:
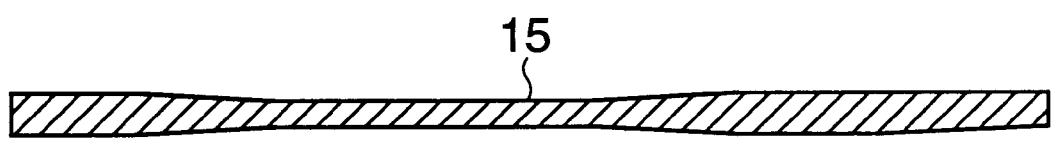
Figure 1D:
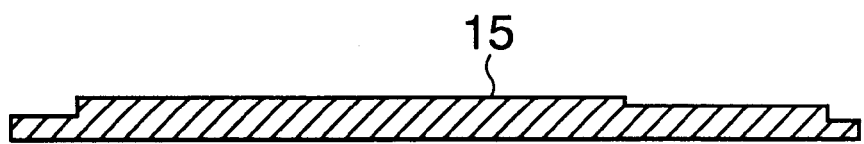

FIGS. 1A to 1D schematically show the model shapes of the titanium oxide whiskers produced by the method of the present invention. As the titanium oxide whisker shape according to the present invention, stringy shape as shown in FIG. 1A, columnar shape as shown in FIG. 1B, columnar shape with diameter changing stepwise as shown in FIG. 1C, and complex shape composed of two or more columnar shapes as shown in FIG. 1D may be provided.

The narrow wires comprising titanium oxide shown by FIGS. 1B, 1C and 1D, produced by the method of the present invention, are the so-called whisker crystals with plane-oriented edges. The whisker dimensions are several nanometers to several microns in diameter and several tens of nanometers to several hundreds of microns in length, depending on conditions under which it is prepared.

Figure 3:
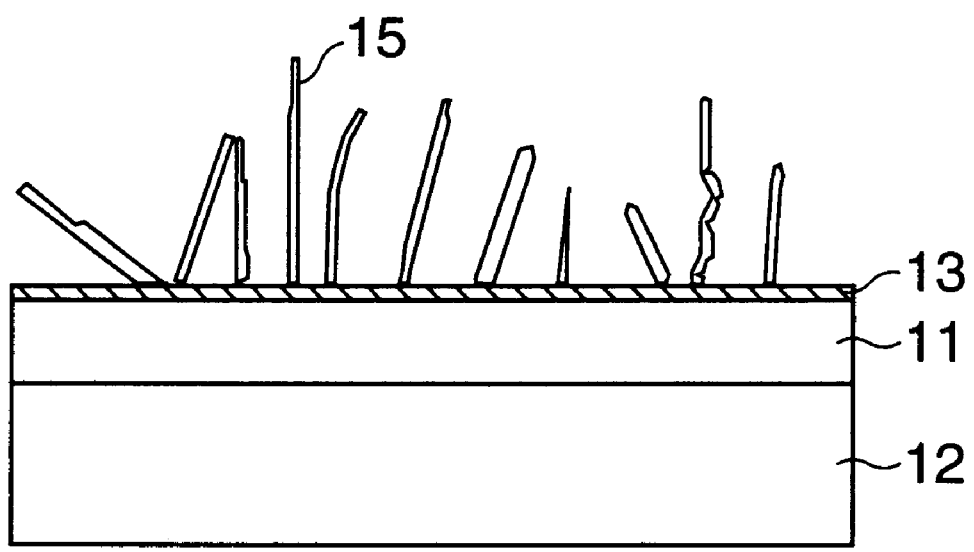
FIG. 3 shows a conceptual view of a nano-structure with the titanium oxide whiskers of the present invention.

A nano-structure shown in FIG. 3, composed of a base 10 and narrow wires 15 of titanium oxide, the latter originating from the former at a certain orientation, can be prepared by the method of the present invention.

It is needless to say that the narrow wires 15 of titanium oxide themselves can be used after being separated from the base of nano-structure.

The narrow wires comprising titanium oxide, produced by the method of the present invention, are high in crystallinity and having a diameter of the order of nanometer, and hence useful for a variety of areas as functional materials for electronic devices and microdevices (e.g., photoelectric conversion elements, photocatalysts and electron-emitting materials), or as structural materials. They may be also used as reinforcing agents for plastics.

The present invention will be described more concretely by Embodiments.

(Embodiment 1)

The method of the present invention for producing narrow wires of titanium oxide is described by referring to FIGS. 2A to 2C in this order.

Step (a)

A base 10 was prepared by sputtering to coat a quartz substrate, sufficiently washed with an organic solvent and pure water, with a 1 μm thick Ti film 11 (see FIG. 2A). The base surface was uneven, with grains of submicron size distributed over the surface of the Ti film 11, as observed by a field emission-scanning electron microscope (FE-SEM) sequent to this step.

Step (c)

The sample prepared by Step (a) was thermally treated in a mixed atmosphere of steam and helium, to grow titanium oxide whiskers.

Figure 4:
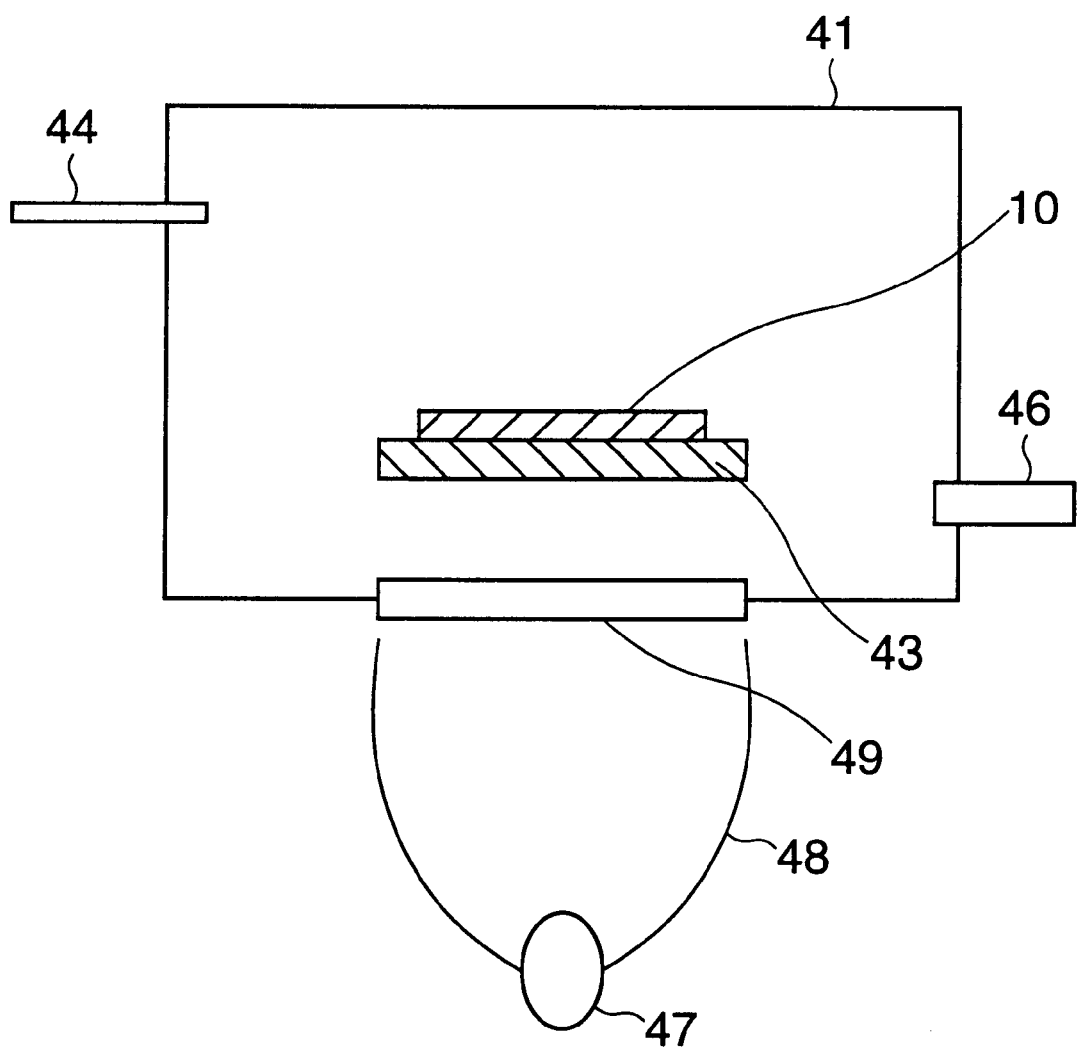
FIG. 4 shows a conceptual view of a thermal treatment/reaction apparatus for growing the titanium oxide whiskers of the present invention.

The sample was placed in the reactor shown in FIG. 4, into which pure water (vapor pressure: 6.5 torr) kept at 5° C. and bubbled by helium gas was introduced through the gas tube 44 at flowrate 50 ml/min, and pressure within the reactor was kept at 760 torr. It was heated at 700° C. by an infrared ray lamp for 1 h (heat treatment). Then, infrared ray lamp was turned out, and the sample was taken out to the air succeeding to cooling down the substrate temperature to room temperature so that the gas supply was stopped.

Assessment (Structural Analysis)

The surface and section of the thermally treated base were analyzed by an FE-SEM (Field Emission-Scanning Electron Microscope).

The analysis confirmed growth of the titanium oxide whiskers from the base. Titanium oxide was of rutile, revealed by X-ray diffractometry.

The titanium oxide whiskers were around 100 to 300 nm in diameter and several hundreds of nanometers to several tens of microns in length, and columnar of high linearity, such as the one shown in FIG. 1B.

Some of the whiskers had plane-oriented edges, clearly grown from the whisker crystals.

(Embodiment 2)

The narrow wires comprising titanium oxide were prepared in Embodiment 2.

The method for producing narrow wires of titanium oxide of the present invention is described by referring to FIGS. 2A to 2C in this order.

Step (a)

A substrate 10 was prepared by sputtering to coat a quartz substrate, sufficiently washed with an organic solvent and pure water, with a 1 pm thick Ti film 11 (see FIG. 2A).

Step (b)

The base prepared by Step (a) was treated by anodic oxidation.

The anodic oxidation was carried out at an anodic oxidation voltage of DC 40 V for 1 min by an apparatus shown in FIG. 5, with 0.3 M aqueous solution of oxalic acid as the acidic electrolytic solution, kept at 17° C. by a constant-temperature water bath. The analysis by an atomic field microscope (AFM) and SEM confirmed that there were irregularities, several tens of nanometers in size, on the base surface.

Step (c)

The sample prepared by Step (b) was thermally treated in a mixed atmosphere of steam and helium, to grow narrow wire 15 comprising titanium oxide.

The sample was placed in the reactor shown in FIG. 4, into which pure water (vapor pressure: 6.5 torr) kept at 5° C. and bubbled by helium was introduced through the gas tube 44 at flowrate 50 ml/min, and pressure within the reactor was kept at 760 torr. It was heated at 700° C. by an infrared ray lamp for 1 h (thermal treatment). Then, infrared ray lamp was turned out, and the sample was taken out to the air succeeding to cooling down the substrate temperature to room temperature so that the gas supply was stopped.

Assessment (Structural Analysis)

The surface and section of the thermally treated sample were analyzed by an FE-SEM.

The analysis confirmed growth of the titanium oxide whiskers from the base. Titanium oxide was of rutile, revealed by X-ray diffractometry.

The titanium oxide whiskers were finer than those of prepared in Embodiment 1, around 10 to 100 nm in diameter and several hundreds of nanometers to several tens of microns in length, and columnar of high linearity, such as the one shown in FIG. 1B. Embodiment 2 produced the whiskers in a slightly higher yield than Embodiment 1.

Some of the whiskers had plane-oriented edges, clearly grown from the whisker crystals.

(Embodiment 3)

In Embodiment 3, the same procedure as used for Embodiment 2 was repeated, except that island structured Al was deposited on the Ti film by thermal evaporation of Al with an equivalent thickness of 0.5 nm in Step (a). Other steps involved were performed in the same manner of Embodiment 2.

The titanium oxide whiskers were around 30 to 200 nm in diameter and several hundreds of nanometers to several tens of microns in length, and columnar of high linearity, such as the one shown in FIG. 1B. Embodiment 3 produced the whiskers in a slightly higher yield than Embodiment 2.

The similar effects were observed when Al was replaced by Ba, Zr, Mo, Y, La, Cu, Zn, Zr or Mo.

It is found that the titanium oxide whiskers are produced in higher yields when an island structured material (e.g., Al) other than Ti is deposited on the Ti film.

(Embodiments 4 and 5)

In Embodiments 4 and 5, the same procedure as used for Embodiment 2 was repeated, except 0.3 M aqueous solution of oxalic acid as the acidic electrolytic solution for the anodic oxidation was replaced by 0.3 M sulfuric acid (Embodiment 4) and 0.3 M sulfuric acid incorporated with 0.01 M $Al_2(SO_4)_3$ (Embodiment 5). Other steps involved were performed in the same manner of Embodiment 2.

The titanium oxide whiskers prepared by Embodiments 4 and 5 were around 10 to 100 nm in diameter and several hundreds of nanometers to several tens of microns in length, and columnar of high linearity, such as the one shown in FIG. 1B. Embodiment 5 produced the whiskers in a slightly higher yield than Embodiment 4.

Embodiment 5 treated the base by anodic oxidation in an acid solution containing Al ions. The similar effects were observed when Al ions were replaced by Li, Na, K, Mg, Ca, Sr, Ba, Cu or Zn ions.

It is found that the titanium oxide whiskers are produced in higher yields when an element (e.g., Al) other than Ti is deposited discretely on the Ti film by adding the ions to the electrolytic solution.

(Embodiment 6)

In Embodiment 6, the same procedure as used for Embodiment 4 was repeated, except that heat treatment was executed in a mixed atmosphere of steam, helium and hydrogen to form the titanium oxide whiskers in Step (c), wherein pure water kept at 5° C. and bubbled by hydrogen diluted with a 50 times larger volume of helium was introduced through the gas tube 44 at 50 ml/min, and pressure within the reactor was kept at 760 torr. It was heated at 700° C. for 1 h.

Embodiment 6 produced the finer titanium oxide whiskers, around 5 to 50 nm in diameter and several hundreds of nanometers to several microns in length, in higher yield as compared with Embodiment 4. The whiskers showed a stringy shape as shown in FIG. 1A, columnar shape as shown in FIG. 1B, columnar shape with diameter changing stepwise as shown in FIG. 1C, and complex shape composed of two or more columnar shapes as shown in FIG. 1D. Some of the whiskers showing shapes shown in FIGS. 1B, 1C or 1D had plane-oriented edges, clearly grown from the whisker crystals.

Thereby, it is found that the thermal treatment of the base with a hydrogen-containing atmosphere tends to produce the finer titanium oxide whiskers in higher yield.

(Embodiment 7)

In Embodiment 7, the same procedure as used for Embodiment 2 was repeated, except that the base 10 was thermally treated in a mixed atmosphere of steam, helium and hydrogen to form the titanium oxide whiskers in Step (c), wherein pure water bubbled by hydrogen diluted with a 50 times larger volume of helium was introduced through the gas tube 44 at 50 ml/min, and pressure within the reactor was kept at 760 torr. It was heated at 700° C. for 1 h. Pure water temperature was set at 1, 5 or 10° C. to vary a vapor pressure and control $H_2O$ concentration of the mixed atmosphere.

It is found that increasing $H_2O$ partial pressure tends to produce the thicker whiskers in higher yields.

(Embodiment 8)

In embodiment 8, the same procedure as used for Embodiment 2 was repeated, except that the base 10 was thermally treated in a mixed atmosphere of oxygen, nitrogen and hydrogen to form the titanium oxide whiskers in Step (c), wherein a mixture of oxygen (20%), hydrogen (2%) and nitrogen (78%) was introduced through the gas tube 44 at 50 ml/min, and pressure within the reactor was kept at 760 torr. It was heated at 700° C. for 1 h.

It is found that the oxidative atmosphere with oxygen tends to produce the thicker and shorter whiskers than that with $H_2O$. However, the whiskers are high in linearity and produced in higher yield.

(Embodiment 9)

In Embodiment 9, the same procedure as used for Embodiment 4 was repeated, except that thermal treatment temperature in Step (c) was varied at 600, 700, 800, 900 and 1000° C.

The base treated at 600° C. had only a limited quantity of the narrow wires of titanium oxide, which were short. Increasing thermal treatment temperature tended to increase titanium oxide whisker length, and the base treated at 700° C. had a number of the whiskers, several microns in length. Increasing thermal temperature further to 800° C. tended to increase whisker diameter, and to 1000° C. tended to decrease whisker length.

(Embodiment 10)

In embodiment 10, the same procedure as used for Embodiment 4 was repeated, except that anodic oxidation voltage was varied at 0, 10, 20, 30 and 40 V. Increasing voltage tended to decrease whisker diameter, and the fine whiskers of 300 nm or less in diameter hold a majority when voltage was increased to 20 V or more.

(Embodiment 11)

A structure comprising the titanium oxide whiskers was prepared in Embodiment 11, where the same procedure as used for Embodiment 4 was repeated, except that the base was thermally treated with an oxygen gas, introduced into the reactor at 10 ml/min, at 1 torr, 600° C. (base temperature) for 1 h.

The whiskers like that shown in FIG. 3 and nano-structure were confirmed by an FE-SEM. The existence of titanium oxide of anatase was confirmed by x-ray diffractometry.

The nano-structures prepared by Embodiment 11 and Embodiments 4 and 8 were deposited with Pt to a thickness of 5 nm by evaporation and irradiated with total light from a high-voltage mercury lamp, while they were immersed in an aqueous solution of methanol (methanol/water: ⅙). Hydrogen was observed to evolve, confirming their photocatalytic activity. The one prepared by Embodiment 11 produced the largest quantity of hydrogen, followed by those prepared by Embodiments 4 and 8, in this order.

(Embodiment 12)

The method of the present invention for producing narrow wires of titanium oxide will be described by referring to FIGS. 2A to 2C in this order.

Step (a)

A plate of 99.99% pure Ti was used as the base 10.

Step (b)

The base 10 prepared by Step (a) was treated by electrolytic polishing in a mixed solvent of sulfuric acid and glycerine, and then surface-polished by a diamond abrasive, 0.25 μm in particle size, to provide irregularities of submicron size on the surface. These irregularities were several hundreds of nanometers in size, as analyzed by an AFM (Atomic Force Microscope) and SEM.

Step (c)

The base 10 prepared by Step (b) was thermally treated in a manner similar to that for Embodiment 2. A large quantity of the whiskers, around 50 to 100 nm in diameter, was produced, as was the case with Embodiment 2. Some of the whiskers had plane-oriented edges, clearly grown as the whisker crystals.

(Embodiment 13)

The method of the present invention for producing narrow wires of titanium oxide will be described by referring to FIGS. 2A to 2C in this order.

Step (a)

A base 10 was prepared by sputtering to coat a quartz substrate, sufficiently washed with an organic solvent and pure water, with a 1 μm thick Ti film 11 (FIG. 2A).

Step (b)

In Embodiment 13, the base prepared by Step (a) was coated with a discontinuous Ba film having an equivalent thickness of 0.5 nm on the Ti film 11 by vacuum evaporation of Ba.

Step (c)

The base 10 prepared by Step (b) was thermally treated in a mixed atmosphere of steam and helium, to grow titanium oxide whiskers.

In Embodiment 13, the base 10 was placed in the reactor shown in FIG. 4, into which pure water (vapor pressure: 6.5 torr) kept at 5° C. and bubbled by helium was introduced through the gas tube 44 at 50 ml/min, and pressure within the reactor was kept at 760 torr. It was heated at 700° C. by an infrared ray lamp for 1 h (thermal treatment). Then, it was cooled in the reactor in the mixed gas stream to room temperature after putting out the infrared lamp, and taken out of the reactor after cutting off the supply of the gas.

Assessment (Structural Analysis)

The surface and section of the thermally treated specimen were analyzed by an FE-SEM.

The analysis confirmed growth of the titanium oxide whiskers from the base. Titanium oxide was of rutile, revealed by X-ray diffractometry.

The titanium oxide whiskers were uniform in diameter and relatively long.

It is considered that the discontinuous Ba film on the surface works as a catalyst to accelerate growth of the whiskers.

The similar effects were observed when the discontinuous Ba film was replaced by that of Al, Cu, Zn, Zr or Mo.

(Embodiment 14)

In Embodiment 14, the same procedure as used for Embodiment 13 was repeated, except Step (b) was replaced by immersion of the base in a 0.1 M aqueous solution of $ZnNO_3$, to attach Zn to the surface.

The above base was thermally treated in a manner similar to that for Embodiment 13. As a result, the whiskers of relatively high linearity were grown at a high density, and many of them were fine.

It is therefore considered that Zn accelerates growth of the whiskers at an area to which it is attached.

The similar effects were observed when the aqueous solution of $ZnNO_3$ was replaced by that of $LiNO_3$, $Na_2PO_4$, KCl, $Mg(NO_3)_2$, $Ca(NO_3)_2$, $BaCl_2$, $Y(NO_3)_3$, $La(NO_3)_3$, $CuSO_4$, or $Zr(SO_4)_2$.

(Embodiment 15)

In Embodiment 15, the same procedure as used for Embodiment 13 was repeated, except Step (b) was replaced by applying a negative potential to the Ti film 11 in a 10 g/L aqueous solution of $CuSO_4$, to coat it with a Cu film having an equivalent thickness of 1 nm by electrodeposition.

The above base was thermally treated in a manner similar to that for Embodiment 13. As a result, the whiskers were uniform in diameter and relatively long.

It is therefore considered that the discontinuous surface film of Cu catalyzes growth of the whiskers.

(Embodiment 16)

In Embodiment 16, the same procedure as used for Embodiment 13 was repeated, except Step (b) was replaced by immersion of the base in a 0.1M solution of sulfuric acid.

The above base was thermally treated in a manner similar to that for Embodiment 13. As a result, the whiskers of relatively high linearity were grown at a high density, and many of them were narrow.

It is therefore considered that surface oxidation by the immersion of the base in sulfuric acid generates fine irregularities on the Ti surface, which is caused by the difference of oxidation speeds in crystal planes and chemical conditions on the surface, thereby accelerating growth of the whiskers.

(Embodiment 17)

In Embodiment 17, the base 10 was treated by anodic oxidation by Step (b) used for Embodiment 2, and then irradiated with ultraviolet ray from a high-voltage mercury lamp (5 kW) for 5 min while it was placed in a 1M $H_2SO_4$ solution. It was then thermally treated under the conditions similar to those for Embodiment 2. The whiskers were produced in a fairly high yield, and many of them were fine.

It is considered that irradiation of ultraviolet ray in acid solution reinforces the grain boundaries and surface irregularities, on account of different surface conditions and hence different etching speeds on the surface, thereby accelerating growth of the whiskers.

(Embodiment 18)

The method of the present invention for producing narrow wires of titanium oxide is described by referring to FIGS. 2A to 2C in this order.

Step (a)

A base 10 for Embodiment 18 was composed of a silica glass substrate, over which a gel of fine titanium oxide particles P25 manufactured by Nippon Aerosyl was spread, after it was sufficiently washed with an organic solvent and pure water. It was heated (baked) at 500° C. for 30 min in the air, to form an approximately 10 μm thick Titanium oxide film 11 on the substrate (FIG. 2A) thereby configuring the base 10.

Step (b)

Next, the above titanium oxide film 11 was irradiated with ultraviolet ray from a high-voltage mercury lamp (5 kW) for 5 min.

Step (c)

Next, the base 10 prepared by Step (b) was thermally treated in a mixed atmosphere of steam and helium, to grow titanium oxide whiskers.

The base 10 was placed in the reactor shown in FIG. 4, into which pure water (vapor pressure: 6.5 torr) kept at 5° C. and bubbled by helium was introduced through the gas tube 44 at 50 ml/min, and pressure within the reactor was kept at 760 torr. It was heated at 700° C. by an infrared ray lamp for 1 h (thermal treatment). Then, it was cooled in the reactor in the mixed gas stream to room temperature after putting out the infrared lamp, and taken out of the reactor after cutting off the supply of the gas.

Assessment (Structural Analysis)

The surface and section of the thermally treated base were analyzed by an FE-SEM (Field Emission-Scanning Electron Microscope).

As a result, the analysis confirmed growth of the titanium oxide whiskers from the base. Titanium oxide was of rutile, revealed by X-ray diffractometry. It was also confirmed that the whiskers of several tens of nanometers in diameter were massively produced, and that irradiation of ultraviolet ray grew the whiskers at a high density.

It is considered that irradiation of ultraviolet ray forms regions of different chemical conditions at the nanometer size (e.g., different oxidation number of Ti) on the surface, to grow the whiskers at a high density, on account of different rates of reaction between the surface and $H_2O$ atmosphere in these regions.

As discussed above, the method of the present invention produces narrow wires comprising titanium oxide of high crystallinity and diameter of the order of nanometer, in particular titanium oxide whiskers, evolving from the base.

The method of the present invention also realizes a nano-structure with narrow wires comprising oriented titanium oxide, in particular titanium oxide whiskers, evolving from the base.

The nano-structure of the present invention, comprising titanium as the major ingredient, can find wide applicable areas as a functional material useful for, e.g., photoelectric conversion elements, photocatalysts and electron-emitting materials, and also as a structural material. The titanium oxide whiskers of the present invention can be also used to reinforce other materials, e.g., plastics.

What is claimed is:

1. A method for producing narrow wires comprising titanium oxide, wherein said method comprises:

(A) a first step of preparing a base having a titanium-containing surface;

(B) a second step of discretely depositing a material other than titanium on the surface; and (C) a third step of thermally treating the surface, obtained by the second step, in a titanium-oxidizing atmosphere.

2. A method for producing narrow wires comprising titanium oxide, wherein said method comprises:

(A) a first step of preparing a base having a titanium-containing surface;

(B) a second step of depositing a material other than titanium on the surface; and (C) a third step of thermally treating the surface, obtained by the second step, in a titanium-oxidizing atmosphere.

3. The method for producing narrow wires comprising titanium oxide as set forth in claim 1 or claim 2, wherein said material other than Ti is selected from the group consisting of Li, Na, K, Mg, Ca, Sr, Ba, Sc, Y, La, Cu, Zn, Al, Zr and Mo.

4. The method for producing narrow wires comprising titanium oxide as set forth in claim 3, wherein said material other than Ti is deposited on said surface by a method selected from the group consisting of evaporation, sputtering and CVD.

5. The method for producing narrow wires comprising titanium oxide as set forth in claim 1 or claim 2, wherein said third step is for thermally treating said surface comprising titanium in an atmosphere containing $O_2$ and $H_2$.

6. The method for producing narrow wires comprising titanium oxide as set forth in claim 1 or claim 2, wherein said titanium-oxidizing atmosphere contains $H_2O$.

7. The method for producing narrow wires comprising titanium oxide as set forth in claim 1 or claim 2, wherein said titanium-oxidizing atmosphere contains $H_2O$ and $H_2$.

8. The method for producing narrow wires comprising titanium oxide as set forth in claim 6, wherein partial pressure of $H_2O$ in said atmosphere is in a range from $1.33\times10^{-2}$ to $2.66\times10^3$ Pa ($10^{-4}$ to 20 torr), inclusive.

9. The method for producing narrow wires comprising titanium oxide as set forth in claim 1 or claim 2, wherein partial pressure of $O_2$ in said atmosphere is in a range from $10^{-3}$ to 200 torr, inclusive.

10. The method for producing narrow wires comprising titanium oxide as set forth in claim 5, wherein partial pressure of $H_2$ in said atmosphere is 100 mtorr or more.

11. The method for producing narrow wires comprising titanium oxide as set forth in claim 1 or claim 2, wherein thermal treatment temperature for said third step is in a range from 600 to 900° C., inclusive.

12. A method for producing narrow wires comprising titanium oxide, wherein said method comprises:

(A) a first step of preparing a base having a titanium-containing surface;

(B) a second step of depositing a metallic element other than titanium on the surface, by bringing a liquid containing the metallic element in contact with the surface; and (C) a third step of thermally treating the surface in a titanium-oxidizing atmosphere.

13. The method for producing narrow wires comprising titanium oxide as set forth in claim 12, wherein said liquid containing the metallic element is an aqueous solution of said metallic element.

14. The method for producing narrow wires comprising titanium oxide as set forth in claim 13, wherein said aqueous solution is an acidic solution.

15. The method for producing narrow wires comprising titanium oxide as set forth in claim 12, wherein said second step involves immersion of said base in said liquid.

16. The method for producing narrow wires comprising titanium oxide as set forth in claim 15, wherein said second step is for anodic oxidation of said titanium-containing surface while said base is immersed in said liquid.

17. The method for producing narrow wires comprising titanium oxide as set forth in claim 12, wherein said material is selected from the group consisting of Li, Na, K, Mg, Ca, Sr, Ba, Sc, Y, La, Cu, Zn, Al, Zr and Mo.

18. The method for producing narrow wires comprising titanium oxide as set forth in claim 12, wherein said titanium-oxidizing atmosphere contains $O_2$ and $H_2$.

19. The method for producing narrow wires comprising titanium oxide as set forth in claim 12, wherein said titanium-oxidizing atmosphere contains $H_2O$.

20. The method for producing narrow wires comprising titanium oxide as set forth in claim 19, wherein said titanium-oxidizing atmosphere contains $H_2O$ and $H_2$.

21. The method for producing narrow wires comprising titanium oxide as set forth in claim 19, wherein partial pressure of $H_2O$ in said atmosphere is in a range from $10^{-4}$ to 20 torr, inclusive.

22. The method for producing narrow wires comprising titanium oxide as set forth in claim 12, wherein partial pressure of $O_2$ in said atmosphere is in a range from $10^{-3}$ to 200 torr, inclusive.

23. The method for producing narrow wires comprising titanium oxide as set forth in claim 18, wherein partial pressure of $H_2$ in said atmosphere is 100 mtorr or more.

24. The method for producing narrow wires comprising titanium oxide as set forth in claim 12, wherein thermal treatment temperature for said third step is in a range from 600 to 900° C., inclusive.

25. A method for producing narrow wires comprising titanium oxide, wherein said method comprises:

(A) a first step of preparing a base having a titanium-containing surface;

(B) a second step of roughening the above surface; and (C) a third step of thermally treating the above surface in a titanium-oxidizing atmosphere.

26. The method for producing narrow wires comprising titanium oxide as set forth in claim 25, wherein said second step involves etching.

27. The method for producing narrow wires comprising titanium oxide as set forth in claim 25, wherein said titanium-oxidizing atmosphere contains $O_2$ and $H_2$.

28. The method for producing narrow wires comprising titanium oxide as set forth in claim 25, wherein said titanium-oxidizing atmosphere contains $H_2O$.

29. The method for producing narrow wires comprising titanium oxide as set forth in claim 28, wherein said titanium-oxidizing atmosphere contains $H_2O$ and $H_2$.

30. The method for producing narrow wires comprising titanium oxide as set forth in claim 28, wherein partial pressure of $H_2O$ in said atmosphere is in a range from $10^{-4}$ to 20 torr, inclusive.

31. The method for producing narrow wires comprising titanium oxide as set forth in claim 25, wherein partial pressure of $O_2$ in said atmosphere is in a range from $10^{-3}$ to 200 torr, inclusive.

32. The method for producing narrow wires comprising titanium oxide as set forth in claim 27, wherein partial pressure of $H_2$ in said atmosphere is 100 mtorr or more.

33. The method for producing narrow wires comprising titanium oxide as set forth in claim 25, wherein thermal treatment temperature for said third step is in a range from 600 to 900° C., inclusive.

34. A method for producing narrow wires comprising titanium oxide, wherein said method comprises:

(A) a first step of preparing a base having a titanium-containing surface;

(B) a second step of irradiating the surface with ultraviolet ray; and (C) a third step of thermally treating the above surface in a titanium-oxidizing atmosphere.

35. A narrow wire comprising titanium oxide, produced by one of the methods as set forth in claims 1, 2, 12, 25 and 34.

36. The narrow wire comprising titanium oxide as set forth in claim 35, wherein said narrow wire is of whisker crystal comprising titanium oxide.

* * * * *